(12) United States Patent
Seningen et al.

(10) Patent No.: US 8,555,121 B2
(45) Date of Patent: Oct. 8, 2013

(54) PULSE DYNAMIC LOGIC GATES WITH LSSD SCAN FUNCTIONALITY

(75) Inventors: Michael R. Seningen, Austin, TX (US); Michael E. Runas, McKinney, TX (US)

(73) Assignee: Apple Inc., Cupertino, CA (US)

( * ) Notice: Subject to any disclaimer, the term of this patent is extended or adjusted under 35 U.S.C. 154(b) by 314 days.

(21) Appl. No.: 13/026,892

(22) Filed: Feb. 14, 2011

(65) Prior Publication Data

US 2011/0202810 A1 Aug. 18, 2011

Related U.S. Application Data

(60) Provisional application No. 61/420,696, filed on Dec. 7, 2010, provisional application No. 61/304,946, filed on Feb. 16, 2010.

(51) Int. Cl.
*G01R 31/28* (2006.01)

(52) U.S. Cl.
USPC .......................................... 714/726; 714/731

(58) Field of Classification Search
USPC .................................................. 714/726, 731
See application file for complete search history.

(56) References Cited

U.S. PATENT DOCUMENTS

| | | | |
|---|---|---|---|
| 5,831,990 A * | 11/1998 | Queen et al. | 714/724 |
| 5,867,507 A * | 2/1999 | Beebe et al. | 714/726 |
| 6,107,835 A * | 8/2000 | Blomgren et al. | 326/98 |
| 7,345,519 B2 | 3/2008 | Hirata | |
| 7,543,205 B2 | 6/2009 | Abhishek | |
| 7,560,965 B2 | 7/2009 | Waldrip et al. | |
| 7,649,395 B2 | 1/2010 | Ahmadi | |
| 7,843,218 B1 | 11/2010 | Ramaraju et al. | |
| 7,994,823 B2 | 8/2011 | Lee et al. | |
| 8,000,165 B2 | 8/2011 | Jung et al. | |
| 2005/0151560 A1* | 7/2005 | Hirata | 326/16 |
| 2005/0235184 A1 | 10/2005 | Yamauchi | |
| 2005/0280459 A1 | 12/2005 | Inoue | |
| 2006/0242505 A1* | 10/2006 | Bialas et al. | 714/726 |
| 2006/0242506 A1* | 10/2006 | Warnock et al. | 714/726 |
| 2007/0198882 A1* | 8/2007 | Namura et al. | 714/726 |
| 2007/0220382 A1* | 9/2007 | Lackey | 714/726 |
| 2008/0022173 A1* | 1/2008 | Chua-Eoan et al. | 714/726 |

(Continued)

OTHER PUBLICATIONS

International Search Report and Written Opinion from PCT/US2011/024921, mailed May 20, 2011, pp. 1-12, Apple Inc.

(Continued)

*Primary Examiner* — Cynthia Britt
(74) *Attorney, Agent, or Firm* — Anthony M. Petro; Meyertons, Hood, Kivlin, Kowert & Goetzel, P.C.

(57) ABSTRACT

A scannable pulse dynamic logic gate may include an evaluation network that evaluates dynamic inputs in response to assertion of an evaluate pulse. The evaluate pulse may be generated from a clock signal such that it is shorter in duration than the clock signal. During a normal mode of operation, when the evaluate pulse is asserted, the evaluation network may discharge a dynamic node depending on the state of the dynamic inputs. The dynamic node may then drive output device(s). When the evaluate pulse is deasserted, the dynamic node may be precharged. The gate may also include scan input devices, which, during a scan mode of operation, may load scan input data onto the output node in response to assertion of a scan master clock. A storage element of the gate may receive and capture a value of the output node in response to assertion of a slave scan clock.

20 Claims, 10 Drawing Sheets

(56) References Cited

U.S. PATENT DOCUMENTS

| | | |
|---|---|---|
| 2008/0100344 A1* | 5/2008 | Ngo et al. .................. 326/98 |
| 2009/0113263 A1* | 4/2009 | Cannon et al. ............. 714/726 |
| 2010/0083062 A1 | 4/2010 | Huang et al. |
| 2011/0202805 A1 | 8/2011 | Seningen et al. |

OTHER PUBLICATIONS

U.S. Appl. No. 13/295,992, filed Nov. 14, 2011, Derrick Leach et al.

U.S. Appl. No. 13/026,878, filed Feb. 14, 2011, Michael R. Seningen et al.

* cited by examiner

PULSE DYNAMIC LOGIC GATES WITH LSSD SCAN FUNCTIONALITY

PRIORITY CLAIM

This application claims benefit of priority of U.S. Provisional Patent Application No. 61/420,696, filed Dec. 7, 2010, which is hereby incorporated by reference in its entirety. This application also claims benefit of priority of U.S. Provisional Patent Application No. 61/304,946, filed Feb. 16, 2010.

BACKGROUND

1. Technical Field

This invention is related to the field of processor implementation, and more particularly to techniques for implementing pulse dynamic logic gates with scan functionality.

2. Description of the Related Art

Processors, and other types of integrated circuits, typically include a number of logic circuits composed of interconnected transistors fabricated on a semiconductor substrate. Such logic circuits may be constructed according to a number of different circuit design styles. For example, combinatorial logic may be implemented via a collection of unclocked static complementary metal-oxide semiconductor (CMOS) gates situated between clocked state devices such as flip-flops or latches. Alternatively, depending on design requirements, some combinatorial functions may be implemented via clocked dynamic gates, such as domino logic gates.

For testability, integrated circuits often include scan functionality through which test patterns can be inserted into a circuit and test results can be read out. Scan-based testing may enable a greater degree of test coverage of a given design than functional testing, in that scan-based testing may facilitate direct access to logic that might otherwise require hundreds or thousands of execution cycles to be evaluated through normal integrated circuit operation. In some cases, scan-based testing may allow testing of circuit elements that might be impractical or even impossible to test through functional testing.

However, most existing methodologies for designing and inserting scan functionality are specific to static logic families. Conventionally, in circuits where dynamic logic gates are employed, such gates are often accepted as simply being non-testable through scan techniques.

SUMMARY

In some embodiments, a scannable pulse dynamic logic gate may include an evaluation network that evaluates dynamic inputs in response to assertion of an evaluate pulse. The evaluate pulse may be generated from a clock signal such that it is shorter in duration than the clock signal. For example, the rising edge of the pulse may occur after the rising edge of the clock signal, and the falling edge of the pulse may occur before the falling edge of the clock signal.

During a normal mode of operation, when the evaluate pulse is asserted, the evaluation network may discharge a dynamic node depending on the state of the dynamic inputs. One or more output devices coupled to the dynamic node may then drive an output node dependent upon the dynamic node. When the evaluate pulse is deasserted, the dynamic node may be precharged.

The pulse dynamic logic gate may also include scan input devices and a storage element. During a scan mode of operation, the scan input devices may load scan input data onto the output node in response to assertion of a scan master clock. The storage element may receive and capture a value of the output node in response to assertion of a slave scan clock. By alternating assertion of the master and slave clocks, scan data may be propagated through a series of interconnected pulse dynamic logic gates.

BRIEF DESCRIPTION OF THE DRAWINGS

The following detailed description makes reference to the accompanying drawings, which are now briefly described.

Figure 1:
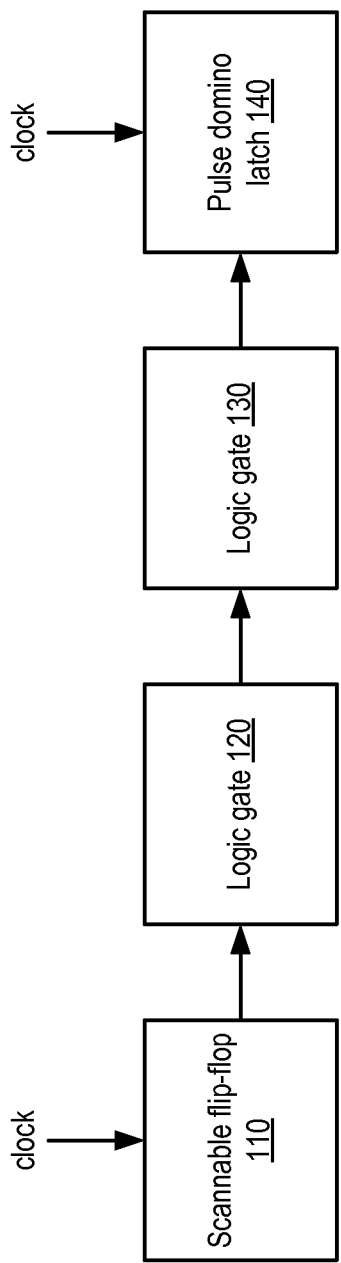
FIG. 1 illustrates an example of a portion of a logic path that uses dynamic logic.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

FIG. 1 illustrates an example of a portion of a logic path that uses dynamic logic (such as domino logic). In the illustrated embodiment, scannable flip-flop 110 is coupled to a logic gate 120, which is in turn coupled to a logic gate 130. Logic gate 130 is coupled to a pulse domino latch 140. Generally speaking, scannable flip-flop 110 may correspond to any suitable scannable state element, such as a static flip-flop. Scannable flip-flop 110 may operate to capture and store input data in response to a clock signal. For example, scannable flip-flop 110 may be a level-triggered or edge-triggered state element.

Logic gates 120 and 130 may be configured to implement combinatorial logic functions of any suitable type (e.g., AND, OR, NAND, NOR, XOR, XNOR, or any suitable Boolean expression). Pulse domino latch 140 may implement a combination of combinatorial logic and a state element. For example, in response to a clock signal, pulse domino latch 140 may operate both to evaluate its inputs and to capture and store a result. By contrast, a typical static combinatorial logic gate does not hold its states and instead may asynchronously evaluate its inputs and change its output whenever the inputs change. Pulse domino gate 140 may reduce the overall delay of the logic path relative to using a discrete static logic gate coupled to a discrete state element, thus potentially increasing the performance of the logic path.

It is noted that the number of logic gates and the connectivity shown in FIG. 1 are merely an illustrative example, and that in other embodiments, other numbers and configurations of gates and state elements may be employed.

In the illustrated embodiment, pulse domino latch 140 is not scannable. Thus, it may not be possible to determine the result of logic gates 120 and 130 directly, as would be the case if a scannable state element were coupled in place of pulse domino latch 140. Instead, to observe logic gates 120 and 130, it may be necessary to capture a result farther down the logic path, after the outputs of logic gates 120 and 130 have been combined with other logic. This may make testing more difficult.

Figure 2:
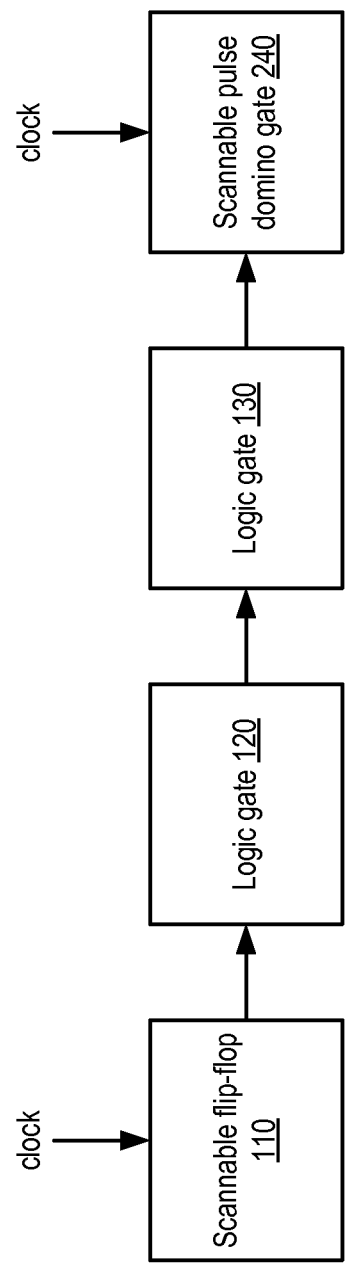
FIG. 2 illustrates a portion of a logic path that employs a scannable pulse dynamic gate.

FIG. 2 illustrates a portion of a logic path that employs a scannable pulse dynamic gate 240 in place of the non-scannable pulse domino latch 140 shown in FIG. 1. In terms of its functional characteristics during normal operating mode, scannable pulse dynamic gate 240 may be similar to non-scannable pulse domino latch 140. For example, both types of gates may implement clocked dynamic logic that may exhibit shorter evaluation latency than equivalent static logic. However, during scan mode, the state of scannable pulse domino gate 240 may be read and/or written, which may facilitate testing of logic upstream and/or downstream from scannable pulse domino gate 240.

Figure 3:
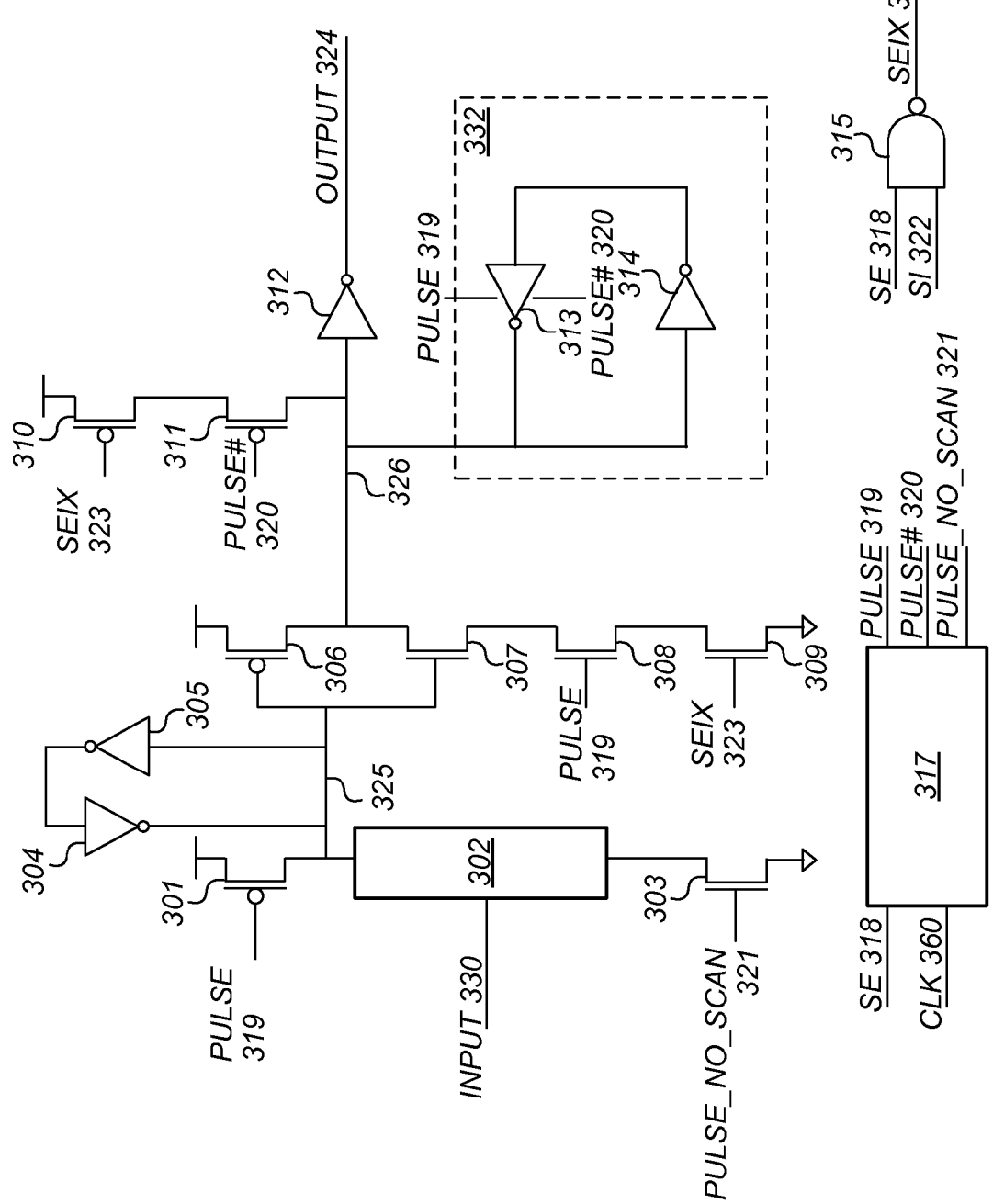
FIG. 3 illustrates an embodiment of a scannable pulse dynamic gate.

FIG. 3 illustrates an embodiment of scannable pulse dynamic gate 240. In the illustrated embodiment, input data 330 is coupled to the evaluation network 302, which is in turn coupled to a precharge device 301 and an evaluate device 303. Precharge device 301 is controlled by a pulse signal 319, and evaluate device 303 is controlled by a pulse_no_scan signal 321. A dynamic node 325 is coupled to the evaluation network 302 and precharge device 301 and further coupled to keeper inverters 304 and 305. Dynamic node 325 is further coupled to an inverter formed by devices 306 and 307 and further controlled by pulse 319 (via device 308) and qualified scan signal SEIX 323 (via device 309). The output of the inverter formed by devices 306 and 307 is coupled to latch node 326, which drives output 324 via inverter 312. Latch node 326 is additionally coupled to a storage element 332 (which may also be referred to as a latch stage) and is controlled by SEIX 323 (via pullup device 310) and pulse #320 (via pullup device 311). Latch stage 332 includes a pair of cross-coupled inverters 313 and 314, of which inverter 313 is selectively controlled by pulse 319 and pulse #320.

It is noted that static CMOS inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS. Moreover, it is noted that although precharge devices, pullup devices, pulldown devices, and/or evaluate devices may be illustrated as individual transistors, in other embodiments, any of these devices may be implemented using multiple transistors or other suitable circuits. That is, in various embodiments a "device" may correspond to an individual transistor or other switching element of any suitable type (e.g., a FET), to a collection of transistors or switches, to a logic gate or circuit, or the like.

In some embodiments, evaluation network 302 may include a tree of devices such as N-type devices (e.g., NFETs) that are coupled to implement a logic function. For example, in response to a particular combination of inputs, certain corresponding devices within evaluation network 302 may be activated, creating one or more paths to ground. Evaluation network 302 may then discharge dynamic node 325 through such a path or paths. That is, in response to one or more of the inputs satisfying the logical function implemented by evaluation network 302, during assertion of the evaluate pulse, one or more discharge paths through evaluation network 302 may be generated among the devices.

In some embodiments, evaluation network 302 may be coupled to receive inputs encoded in a 1-of-N format. Generally speaking, in a 1-of-N format, an input signal may have N individual components, at most one of which may be asserted or logically true at a given time. Individual components of a 1-of-N signal may be implemented by a corresponding wire or metal trace that is coupled to one or more corresponding devices within evaluation network 302. For example, a 1-of-4 input signal may be implemented as a bundle of four wires routed to scannable pulse dynamic gate 240, of which at most 1 wire may be driven to a high voltage (corresponding to assertion) at a given time. When a particular wire is asserted in this manner, one or more corresponding devices within evaluation network 302 may be activated. Depending on the logical function implemented by evaluation network 302, such activation may or may not affect the output state of scannable pulse dynamic gate 240.

In the illustrated embodiment, clock generator 317 may be configured to generate several variants of a pulse signal from an input clock 360 and a scan enable signal 318. In some embodiments, a pulse may correspond to a signal that is generated from a clock signal but which is asserted for a shorter period of time than the clock signal from which the pulse is generated. That is, a pulse may be understood to be a synchronous signal, like a clock signal, but may have timing characteristics that both differ from and depend on a clock signal. In various embodiments, the occurrence of the rising and/or falling edges of a pulse relative to a clock signal may be tuned based on the timing requirements of a particular gate or path. Both the duration of the pulse and the locations of its edges relative to a clock signal may be varied. For example, the pulse may be generated such that its rising edge occurs after the rising edge of the clock signal and its falling edge occurs before the falling edge of the clock cycle.

Using pulses rather than clocks may help to improve circuit performance. In the context of dynamic logic, a synchronous signal usually determines the period of time during which inputs are evaluated. For example, a dynamic logic circuit controlled by a clock signal may evaluate its inputs when the clock signal is high (also referred to as the circuit's "evaluate phase"). When the clock signal is low (also referred to as the circuit's "precharge phase"), the dynamic logic circuit may be insensitive to changes in its inputs. Generally speaking, it is often necessary to ensure that an input signal to a dynamic logic circuit is stable for at least a certain length of time (also referred to as "hold time") during and/or following the circuit's evaluate phase in order to ensure correct circuit operation. For example, if hold time requirements were not satisfied by the input to a particular gate (that is, if the input began to transition prematurely), the input might fail to be captured by the gate, possibly causing the gate to fail to evaluate correctly. Alternatively, the premature transition may cause the gate to spuriously evaluate (for example, by creating a path within evaluation network 302 that causes dynamic node 325 to discharge when it otherwise would not have). Such behaviors may cause incorrect circuit operation.

To mitigate failures due to hold time violations, designers may adopt circuit design rules that specify minimum hold times for various signals. However, such hold time requirements may limit the speed of circuit operation, because for a gate that generates a given input signal to another gate, longer hold times for the given input signal usually leave less time for the generating gate to do useful work.

In dynamic gates, hold time requirements are often dependent upon the length of the evaluation phase. That is, it is generally unnecessary to hold an input signal beyond the end of the evaluation phase, because a correctly operating dynamic gate should be insensitive to input changes that occur outside of the evaluation phase. By using a pulse instead of a clock signal to control the evaluation of dynamic gates, the length of the evaluation phase of a gate may be shortened (because, as discussed above, pulses have a shorter asserted duration than their corresponding clocks). By shortening the evaluation phase, it may be possible to allow the input signals to transition earlier than if a clock signal were used. That is, use of a pulse may reduce input signal hold time requirements. This in turn may increase the frequency at which the circuit may be able to operate.

As shown in FIG. 3, pulse generator 317 may generate a pulse output 319 as well as a pulse# output 320 that has a logical sense that is the opposite of pulse 319. (That is, when pulse 319 is high, pulse #320 is low and vice versa.) Pulse generator 317 may also generate a pulse_no_scan output 321 that is qualified with scan enable 318 such that when scan enable 318 is asserted (e.g., high or logically true, indicating that a scan mode of operation is active), pulse_no_scan 321 is deasserted (e.g., low or logically false), preventing the discharge of dynamic node 325. Thus, in the illustrated embodiment, pulse generator 317 may generate a free-running pulse 319 that asserts whenever clock 360 is running, as well as a qualified pulse_no_scan 321 that asserts dependent upon whether or not the circuit is operating in scan mode. It is noted that in other embodiments, pulse generator 317 may be configured to generate a different number or configuration of pulses. The timing characteristics of the generated pulses may vary according to the specific implementation constraints of the circuit.

In the illustrated embodiment, NAND gate 315 may be configured to combine scan enable SE 318 with scan data SI 322 to create signal SEIX 323. In functional terms, SEIX 323 may represent inverted scan data qualified with the scan enable signal. That is, if SE 318 is deasserted (e.g., low), SEIX 323 may be high regardless of the value on scan data SI 322. If SE 318 is asserted (e.g., high) to indicate scan mode operation, then SEIX 323 may output the complement of SI 322.

Figure 4:
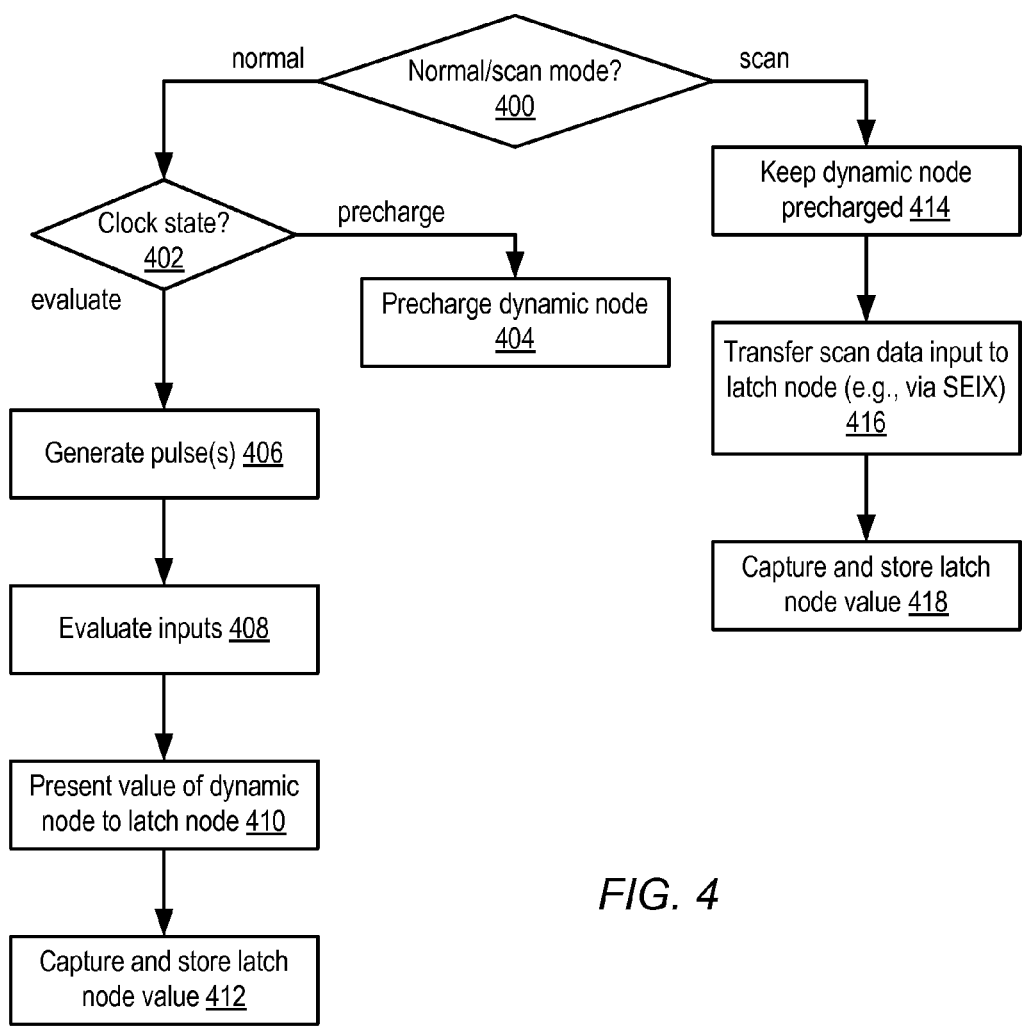
FIG. 4 illustrates an embodiment of a method of operation of a scannable pulse dynamic gate.

In some embodiments, the illustrated scannable pulse dynamic gate may operate as follows. Referring collectively to FIG. 3 and the flow chart illustrated in FIG. 4, operation may depend on whether or not the gate is operating in scan mode (block 400). Considering first a normal, non-scan mode of operation, operation may further depend on the state of clock 360 (block 402). When clock 360 is inactive (low), pulse 319 may also be low, causing dynamic node 325 to be precharged high via device 301 (block 404). During normal mode operation, scan enable SE 318 is low, causing SEIX 323 to be high as discussed above. This in turn activates device 309.

When clock 360 is active (high) and scan enable SE 318 remains low, pulse generator 317 generates pulse 319, pulse #320, and pulse_no_scan 321 (block 406). For the duration of these pulses, device 301 is inactive and devices 303, 308, and 311. The state of inputs 330 to evaluation network 302 may be evaluated (block 408), during which dynamic node 325 may or may not discharge through evaluation network 302 and device 303. If dynamic node 325 does not discharge in this fashion, a keeper network (shown as keeper inverters 304 and 305) may maintain the precharged state of dynamic node 325 for the duration of the pulses.

The value on dynamic node 325 may then be presented to the latch node (block 410). If dynamic node 325 discharges, then the low voltage on dynamic node 325 causes a high voltage to be transferred to latch node 326 via device 306. If dynamic node 325 does not discharge, then when pulse 319 is active, the high voltage on dynamic node 325 causes a low voltage to be transferred to latch node 326 via devices 307, 308, and 309. (As noted above, SEIX 323 is high during normal mode operation, causing device 309 to be activated.) The value of latch node 326 is then inverted and presented as output 324, though in other embodiments, a non-inverted output may additionally or alternatively be provided.

When pulse 319 and pulse #320 are in their active states (e.g., high and low, respectively), tri-state inverter 313 may be placed in a high-impedance state that prevents contention on latch node 326. When pulse 319 and pulse #320 return to inactive states (e.g., low and high, respectively), tri-state inverter 313 may activate and drive latch node 326, causing the value of latch node 326 to be captured and stored via the feedback loop of tri-state inverter 313 and inverter 314 (block 412).

During a scan mode of operation, as mentioned above, pulse_no_scan 321 will remain inactive, causing dynamic node 325 to remain precharged regardless of the inputs 30 presented to evaluation network 302 (block 414). During scan mode, the value of latch node 326 may depend on the state of SEIX 323 (block 416). If scan input data SI 322 is low, SEIX 323 will be high. Combined with the high state of dynamic node 325, this configuration may cause a low voltage to be transferred to latch node 326 when pulse 319 is active. (For this combination of inputs, the high state of SEIX 323 causes device 310 to be inactive.) If scan input data SI 322 is high during scan mode, SEIX 323 will be low, causing device 309 to turn off and device 310 to turn on. When pulse #320 is active (low), device 311 will also be active. This configuration may cause a high voltage to be transferred to latch node 326. The operation of tri-state inverter 313 and inverter 314 to latch the scan data value placed on latch node 326 may be similar to that described above for the normal operating mode (block 418).

Figure 5:
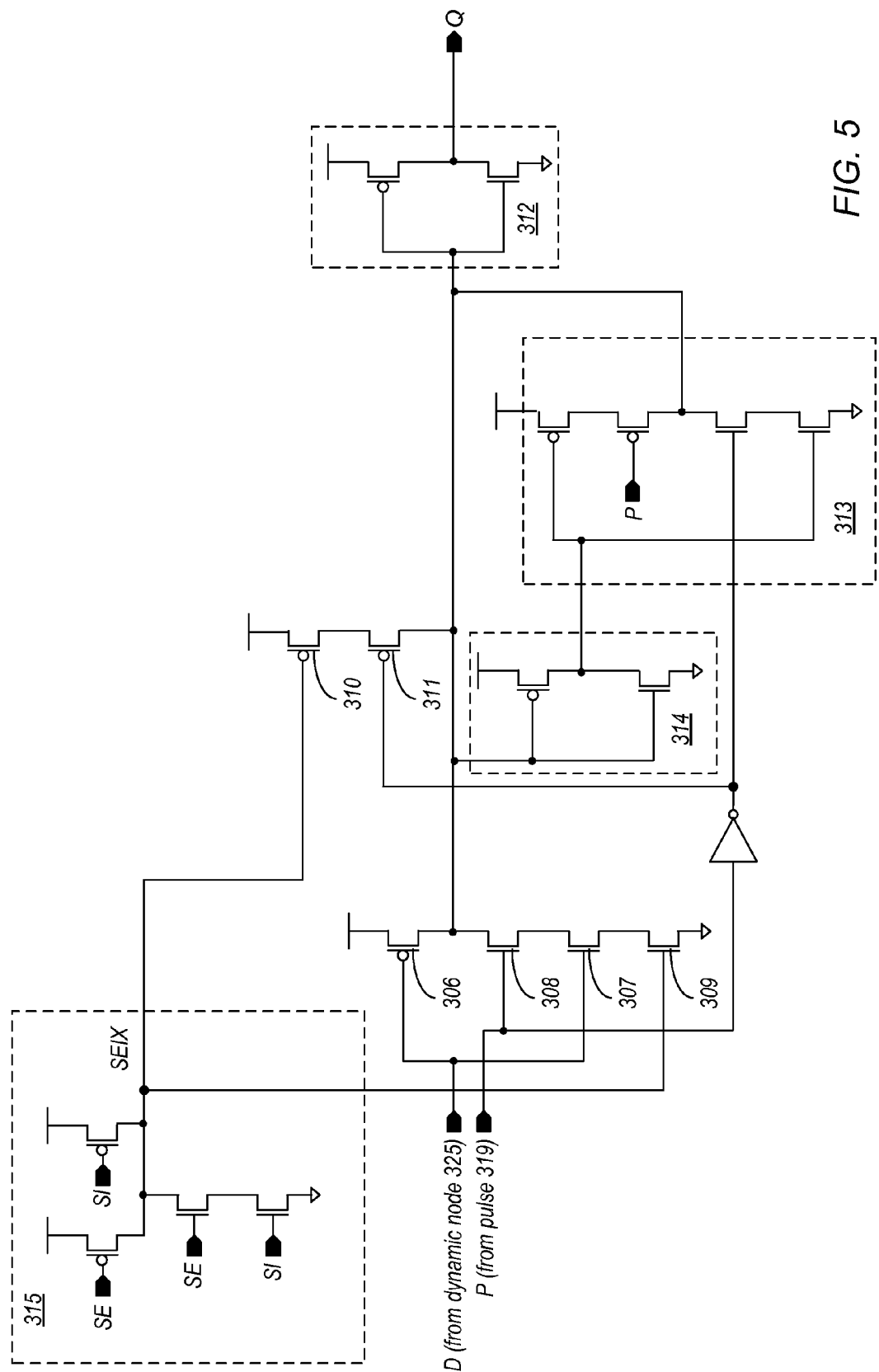
FIG. 5 illustrates an example of a circuit that may be used to implement the latch functionality of a scannable pulse dynamic gate.

FIG. 5 illustrates one particular example of a circuit that may be used to implement the storage functionality of the scannable pulse dynamic gate 240 of FIG. 3. In the illustrated embodiment, transistors implementing NAND 315 are shown in the upper left portion of the circuit. The D input may be coupled to dynamic node 325, while the P input may be coupled to pulse 319. (In FIG. 5, the complemented pulse# signal is shown as locally generated from an inversion of pulse 319, although this signal may also be generated by an external source.) As shown in FIG. 5, the ordering of devices 306, 307, 308, and 309 may vary depending on implementation choices (e.g., to place timing-critical inputs closer to the output of the gate). As noted previously, the output inverter may be omitted in some embodiments. It is noted that although FIG. 5 generally illustrates a level-sensitive latch, in other embodiments, any other suitable type of storage element may be employed to store a value within any of the embodiments discussed herein, including storage elements comprising edge-triggered circuits, dynamic circuits, non-volatile storage, or the like.

Figure 6:
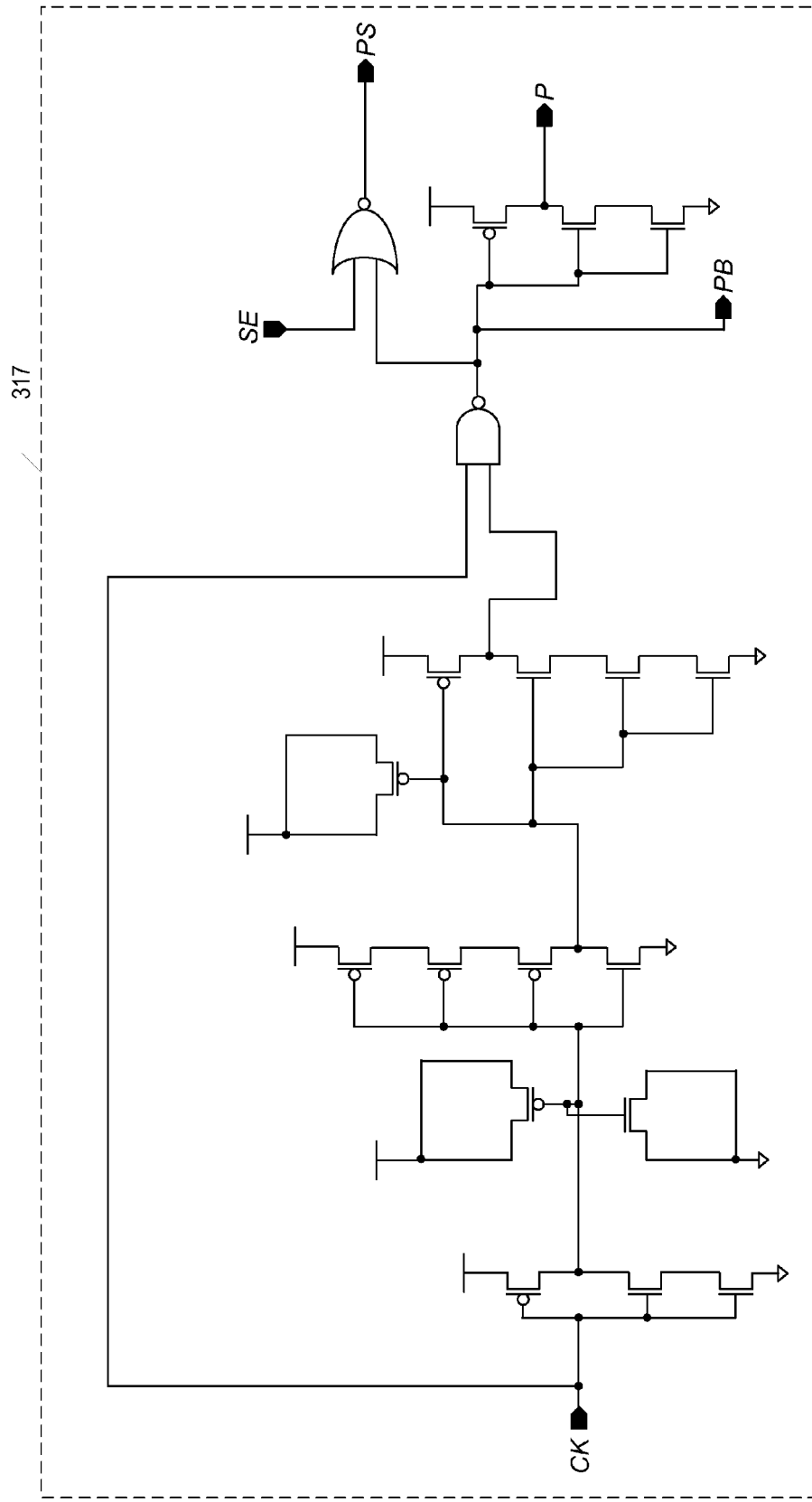
FIG. 6 illustrates an embodiment of a pulse generator circuit.

FIG. 6 illustrates an example of a circuit that may be used to implement pulse generator 317. In the illustrated embodiment, an input clock CK is passed through a delay chain that may include several different types of devices: inverters with redundant devices, capacitive loads coupled to the signal path, and/or wire delay. The specific configuration of the delay chain may vary for each given instance of pulse generator 317 depending on the timing characteristics of the gate to be driven. For example, a longer delay chain may create a longer pulse, and vice versa. Moreover, adding or removing delay from both clock paths may vary the relative delay between the rising edge of the input clock and the rising edge of the resultant pulse.

The delayed version of CK is coupled to the input clock CK via a NAND gate to generate an inverse pulse denoted PB. This pulse then passes through an inverter to generate a positive-sense pulse P. PB is also combined with a scan enable signal via a NOR gate to generate the scan-qualified pulse PS. In the embodiment of FIG. 6, signals P, PB, and PS may correspond respectively to signals pulse 19, pulse #20, and pulse_no_scan 21 of FIG. 3.

Figure 7:
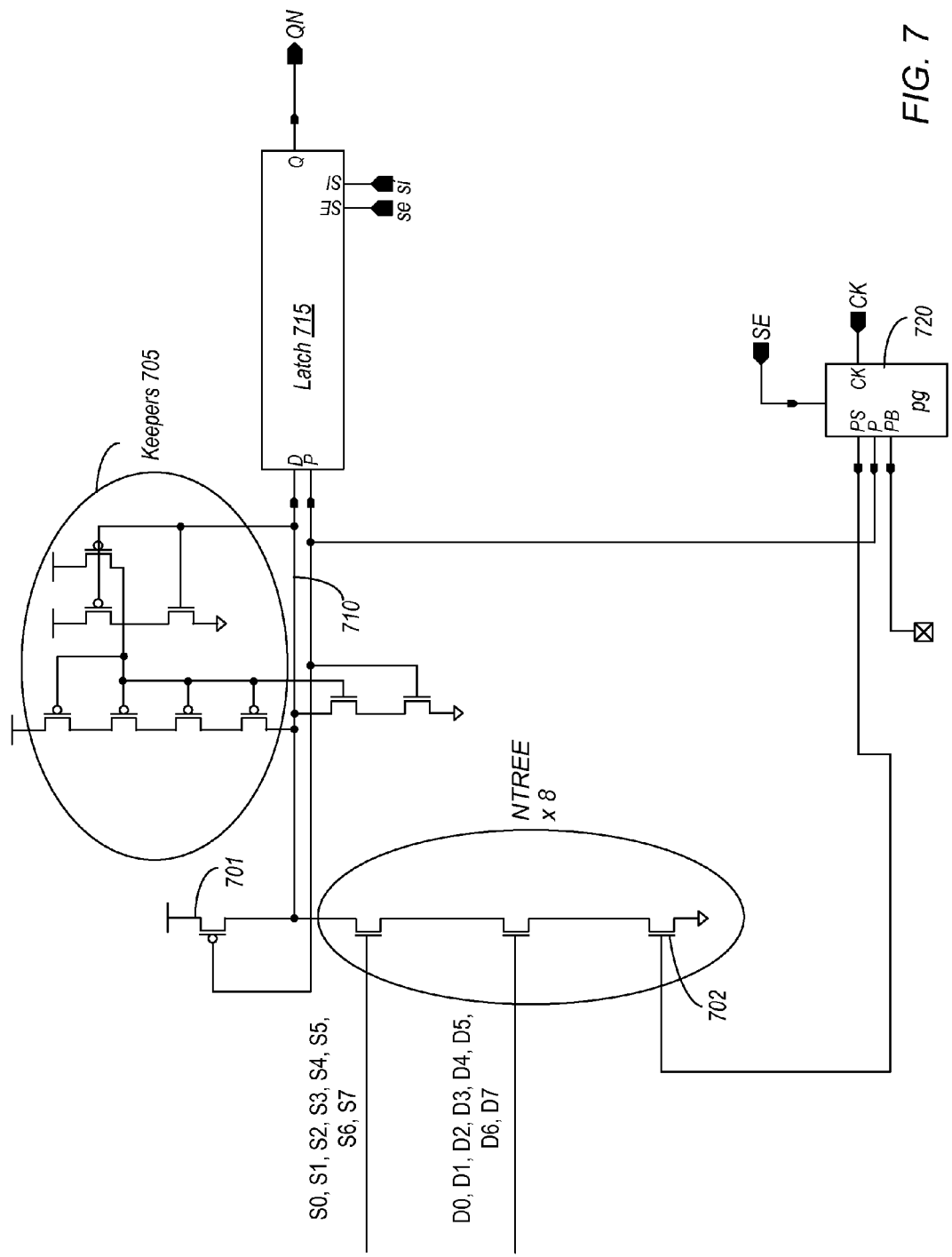
FIG. 7 illustrates an example of the use of scannable pulse dynamic gates to implement a particular logic function.

FIG. 7 illustrates an example of the use of scannable pulse dynamic gates to implement a particular logic function. In the illustrated embodiment, a combination of gates may be configured to implement a 1-of-8 multiplexer (that is, a circuit that selectively outputs any one of eight input values). In the illustrated embodiment, a pulse generator circuit PG 720 is shown coupled to receive a clock input CK and a scan enable signal SE and to produce pulse signal P, PB, and PS. For example, the pulse generator circuit 317 shown in FIG. 6 or a suitable alternative may be used in FIG. 7.

In the circuit of FIG. 7, the generic evaluation network shown in FIG. 3 is replaced with eight instances of a two-transistor stack, where the top transistor is controlled by one of eight possible select signals denoted S0 through S7, and where the bottom transistor is controlled by one of eight possible data values denoted D0 through D7. (For simplicity, all sixteen devices of the evaluate tree for this example are not individually shown.) The tops of the two-transistor stacks are joined at one or more precharge devices 701 controlled by pulse P, and the bottoms of the stacks are joined at one or more evaluate devices 702 also controlled by pulse P. The keeper structure 705 shown in FIG. 7 differs somewhat from the inverters 304 and 305 shown in FIG. 3, but may perform a similar function of preserving the value on the dynamic node 710 when it does not discharge through the evaluation network. The dynamic node is coupled to a latch 715, which may correspond to the latch circuit shown in FIG. 5, or another suitable type of latch circuit.

During normal, non-scan operation, when signal PS is active, the circuit of FIG. 7 evaluates inputs S0 through S7 and D0 through D7. In the illustrated embodiment, at most one of the select inputs S0 through S7 may be asserted. If the corresponding data input for an asserted select input is also asserted, the dynamic node may discharge, causing a low voltage to be presented to latch circuit 715. If the corresponding data input for an asserted select input is not asserted, the dynamic node may remain precharged, causing a high voltage to be presented to latch circuit 715. As discussed above with respect to FIGS. 3-5, the value on the dynamic node may be stored within the latch and driven from the latch in either true or complemented form.

During scan operation, the pulse generator circuit PG 720 may cause pulse signal PS to remain inactive, preventing the dynamic node from discharging through the evaluation network. Instead, the value written into the latch circuit 715 may be determined by the scan data input SI in a manner similar to that discussed above with respect to FIGS. 3 and 4.

Although FIG. 3 illustrates a generic evaluation network and FIG. 7 illustrates an evaluation network that implements a multiplexer, it is contemplated that any type of Boolean function may be implemented by the evaluation network of a scannable pulse dynamic gate. It is further contemplated that any of a number of input encodings may be employed, including single-ended dynamic inputs (e.g., employing a return-to-zero or RTZ encoding), dual-rail dynamic inputs, or 1-of-N dynamic inputs, where N may be any number.

The pulse dynamic gate illustrated in FIG. 3 may be understood to implement a multiplexed-data style of scan, which may also be referred to as MUX-D. Generally speaking, in MUX-D scan, scan data may be multiplexed onto the same path as functionally-generated data under control of the same clock that is used during normal functional mode (i.e., non-scan) operation. Another style of scan implementation is level-sensitive scan design (LSSD), which may employ a scan clock that is distinct from the functional-mode clock. The use of a separate scan clock may enable more robust scan timing performance (e.g., by reducing hold time issues associated with scan), though LSSD gates may require more area than comparable MUX-D gates.

Figure 8:
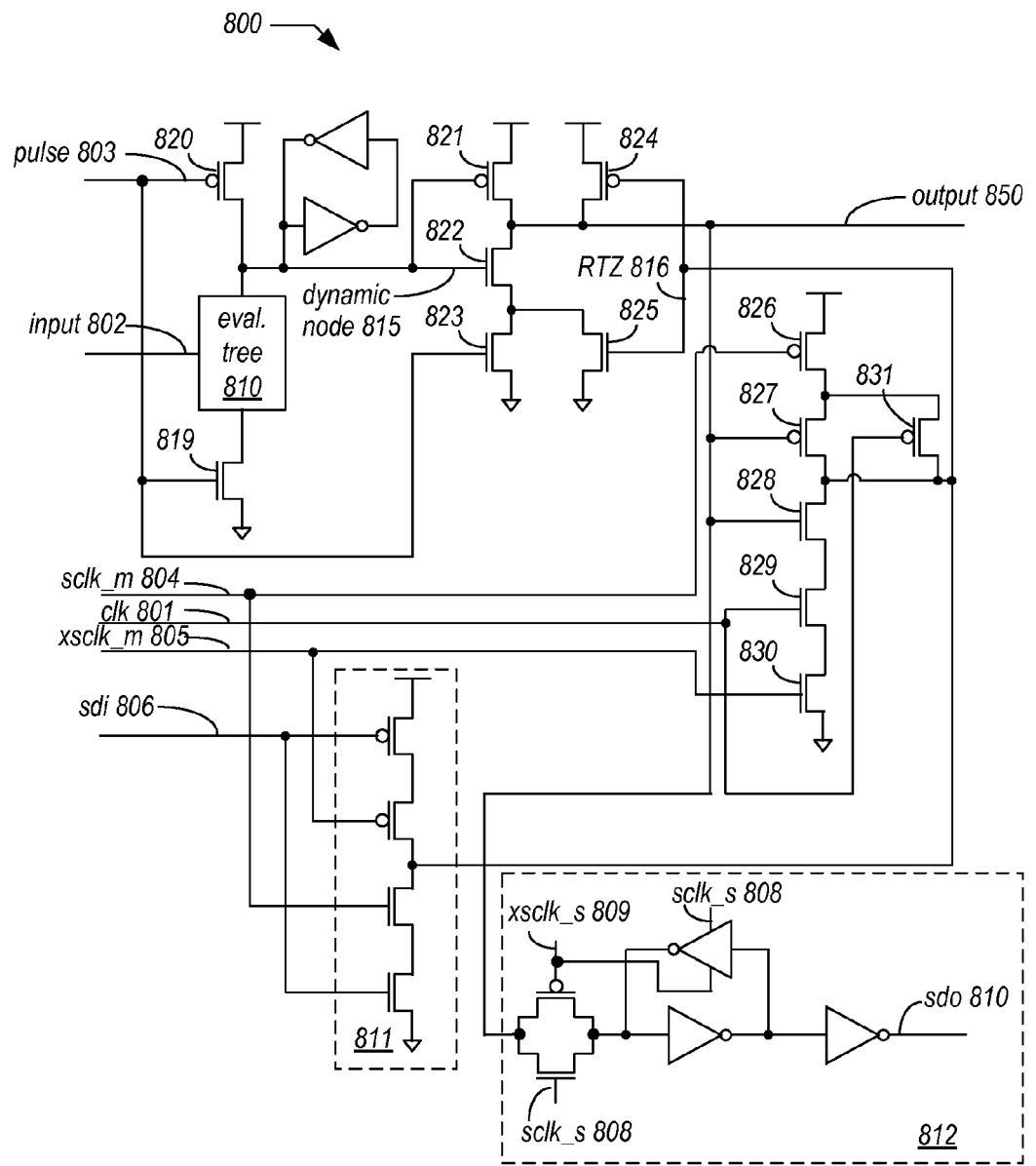
FIG. 8 illustrates another embodiment of a scannable pulse dynamic gate.

FIG. 8 illustrates an example of a pulse dynamic gate that implements LSSD-style scan functionality. In the illustrated embodiment, LSSD pulse dynamic gate 800 receives one or more data input signals 802 coupled to an evaluation network 810, as well as a variety of clock signals. The pulse input 803 may correspond to a pulse signal generated in a fashion similar to that discussed above with respect to FIGS. 3-5. The signal clk 801 may correspond to the clock from which the pulse is generated, or an equivalent clock (e.g., in the event that pulse 803 is not generated directly from clk 801, but instead from a clock signal that is upstream or downstream from clk 801). The signals sclk_m 804 and sclk_s 808 denote master and slave scan clocks, respectively, and xclk_m 805 and xclk_s 809 denote the inverse of these scan clocks. The primary data output of the illustrated LSSD pulse dynamic gate is denoted out 850, and the scan data input and scan data output are denoted sdi 806 and sdo 810, respectively.

Figure 9:
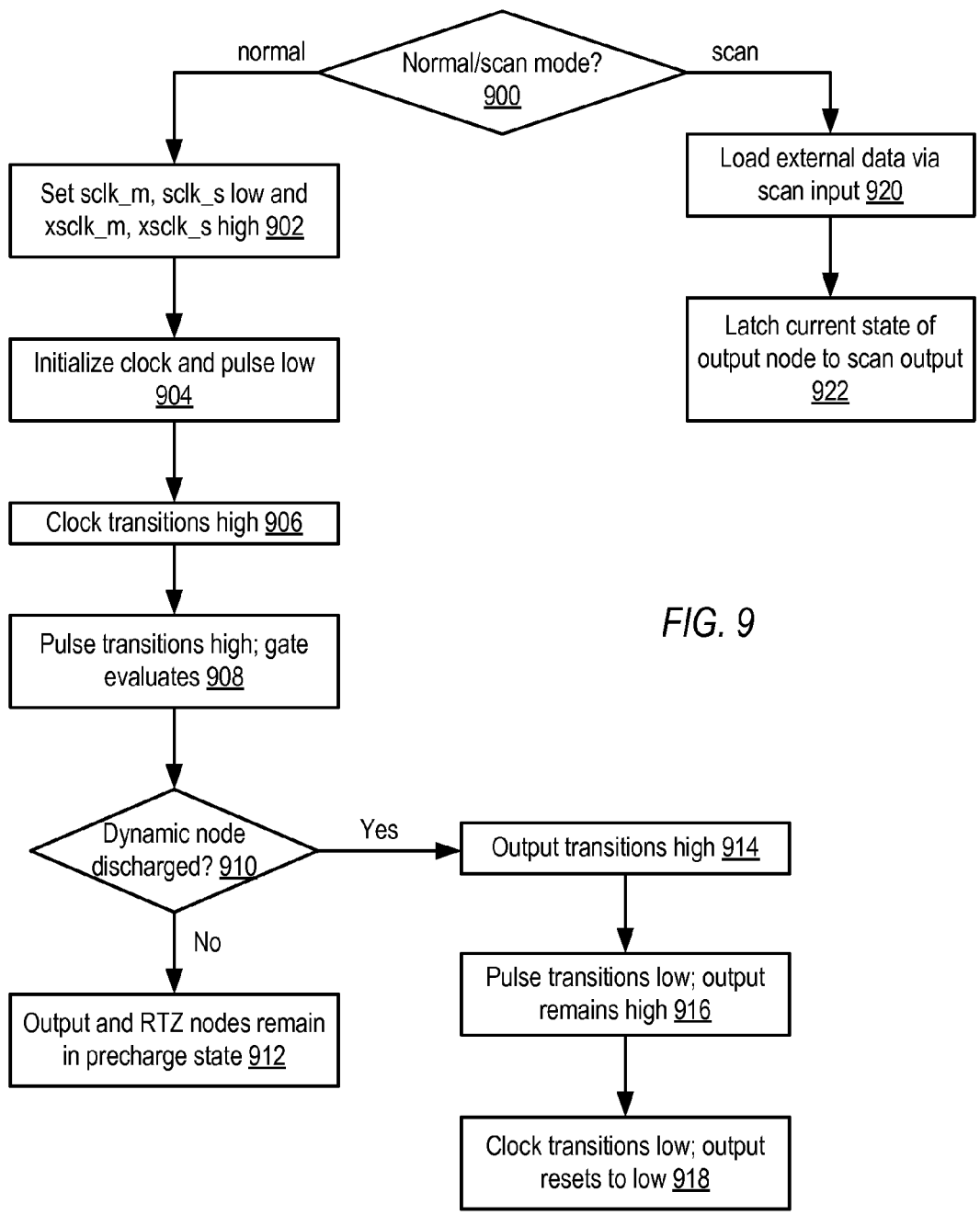
FIG. 9 illustrates an embodiment of a method of operation of the gate of FIG. 8.

In some embodiments, LSSD pulse dynamic gate 800 may operate as follows. Referring collectively to FIG. 8 and the flow chart illustrated in FIG. 9, operation may depend on whether or not the gate is operating in scan mode (block 900). Considering first a normal, non-scan mode of operation, sclk_m 804 and sclk_s 808 may be set to a low state, and their inverses xclk_m 805 and xclk_s 809 may be set to a high state (block 902).

Operation may further depend on the state of clk 801 and pulse 803. Initially, clk 801 and pulse 803 may be set to a low state (e.g., a logic 0 represented by a low voltage sufficient to turn on a PFET device and turn off an NFET device), placing gate 800 in a precharge state (block 904). In the illustrated embodiment, transistor 819 may be off and 820 may be on, causing dynamic node 815 to be precharged to a high state (e.g., a logic 1 represented by a high voltage sufficient to turn off a PFET device and turn on an NFET device), in turn causing transistor 821 to be off and transistor 822 to be on. Additionally, in this state, transistors 826 and 831 may be on (via sclk_m 804 and clk 801 being low and high, respectively). This may cause the node RTZ 816 to be high, enabling transistor 825 and disabling transistor 824. (The node RTZ 816 may also be referred to more generically as a feedback node.) Via transistors 822 and 825 being on, there exists a path from output 850 to ground, causing output 850 to be low.

To begin the transition from precharge to evaluate mode, clk 801 may transition to a high state (block 906). In the illustrated embodiment, the transition on clk 801 may cause transistor 831 to turn off and transistor 829 to turn on. The state of node RTZ 816 may not change at this time, because as long as output 850 remains in a low, precharge-mode state, transistor 827 will remain on and transistor 828 will remain off, keeping RTZ 816 high.

After clk 801 transitions high, pulse 803 may transition high, and gate 800 may enter evaluate mode (block 908). In the illustrated embodiment, this transition on pulse 803 may turn on transistors 819 and 823 and turn off transistor 820. Depending on the state of input(s) 802, evaluate tree 810 then may or may not discharge dynamic node 815 (block 910). For example, the state of the input signals may or may not create a path from dynamic node 815 to ground through evaluate tree 810 and transistor 819.

Assuming that dynamic node 815 does not discharge, node RTZ 816 and output 850 may remain in their precharge states during evaluate mode (block 912). Eventually, pulse 803 and clk 801 may transition back to a low state, and gate 800 may responsively return to the precharge state described above.

Assuming that dynamic node 815 does discharge, output 850 may transition to a high state (block 914). In the illustrated embodiment, discharge of dynamic node 815 may turn transistor 822 off and transistor 821 on, and the latter device may pull up output 850. The high state on output 850 may cause transistor 827 to turn off and transistor 828 to turn on. Because transistors 829 and 830 are already on (due to clk 801 and xsclk_m 805 both being high), node RTZ 816 may discharge to ground in response to the rising transition on output 850. This in turn may turn on transistor 824 and turn off transistor 825, creating a feedback loop that causes output 850 to continue to be pulled high via transistor 824 regardless of the state of dynamic node 815. Devices 826-831 may individually or collectively be referred to as feedback devices. In other embodiments, the feedback device(s) of gate 800 may include a different arrangement of transistors, gates, circuits, or the like.

Subsequent to the discharge of dynamic node 815, pulse 803 may return to a low state (block 916). In the illustrated embodiment, transistor 819 and 823 responsively turn off while transistor 820 responsively turns on, causing dynamic node 815 to begin precharging. However, the feedback loop discussed above may keep output 850 high during the period between the falling edge of pulse 803 and the falling edge of clk 801.

More specifically, in the illustrated embodiment, output 850 is implemented in a return-to-zero format in which it is held until the falling edge of clk 801 and then reset to zero if output 850 is in a nonzero state. For example, as discussed above, when output 850 is low, node RTZ 816 may be high regardless of the state of clk 801, causing output 850 to be held low throughout the duration of clk 801 if dynamic node 815 remains precharged. Output 850 may go high during the evaluate phase (e.g., when pulse 803 is high) if evaluation tree 810 discharges dynamic node 815. In this event, so long as both the output and clk remain high, the RTZ node will be low, causing the output to remain high through the pullup device controlled by the RTZ node.

Eventually, clk 801 will return to a low state (block 918). When it does, the NAND structure that drives the RTZ node (e.g., transistors 827, 828, 829, and 831) may cause node RTZ 816 to rise, which in turn may cause output 850 to transition low via transistors 825 and 822. That is, the falling edge of clk 801 may cause output 850 to reset to a low state if it was in a high state, or to remain in a low state if already low. It is noted that while an RTZ output may be useful in interfacing a dynamic gate to other types of logic (e.g., static logic), this style of output is optional, and in other embodiments, an LSSD pulse dynamic gate may be implemented with any suitable type of output.

One clk 801 returns to a low state, the cycle is complete, and another precharge-evaluate cycle may occur.

During scan mode operation of gate 800, external scan data may be loaded onto output 850, or the current state of output 850 may be captured and output to the scan chain via sdo 810. Although these are shown as separate operations in FIG. 9, depending on the sequencing of master and slave scan clocks sclk_m 804 and sclk_s 808, in some embodiments it may be possible to both capture the current state of output 850 and load external scan data onto output 850, or to load external scan data onto output 850 and cause this external data to also be output to the scan chain.

External data may be loaded onto the output node of the illustrated gate via the sdi 806 input (block 920). In the illustrated embodiment, sclk_m 804 may initially be set high, which may disable the RTZ NAND structure by deactivating transistor 826 and may enable the clock-qualified inverter 811 coupled to sdi 806. (The devices included in inverter 811 may individually or collectively be referred to as scan input devices, and in other embodiments, a different arrangement of scan input devices may be employed.) This in turn may cause the inverse of sdi 806 to be coupled to node RTZ 816. That is, if sdi 806 is low, RTZ 816 may be high, causing output 850 to be driven low via transistors 825 and 822. Conversely, if sdi 806 is high, RTZ 816 may be low, causing output 850 to be driven high via transistor 824.

The current data that is present on output 850 may then be latched (block 922). As noted above, the current data may either be the data that was just loaded via sdi 806, or the current state of output 850 as a result of evaluation of evaluation tree 810. In the illustrated embodiment, the capture of output 850 into slave latch 812 may be initiated by returning sclk_m 804 to a low state (if it was asserted) and setting sclk_s 808 and xsclk_s 809 to high and low states, respectively. This may cause the data held at output 850 of pulse dynamic gate 800 to be transferred through pass transistors 808-809 to the scan data output port sdo 810. When the state of output 850 has been captured by latch 812, clk_s 808 may go low and xclk_s 809 may go high. At this point, the pass transistors 808-809 may close and the state of output 850 may be held in the illustrated pair of keeper inverters within latch 812. After clk_s 808 goes low and the data has been latched in the slave latch, pulse dynamic 800 gate may then return to a precharge state.

In some embodiments, the sdo 810 output of one pulse dynamic gate may be coupled to the sdi 806 input of another pulse dynamic gate to form a scan chain. It is noted that if sclk_m 804 and sclk_s 808 are sequentially pulsed in an alternating fashion, a sequence of scan data may be propagated along the scan chain to load data into gates along the scan chain and/or to read data from those gates.

It is noted that although various specific circuit arrangements and device types have been discussed above, in other embodiments, other types of circuits, design styles, and/or device types may be employed. For example, although CMOS circuits employing N-type and P-type field effect transistors (NFETs and PFETs, respectively) have been shown and described above, in other embodiments, other types of devices (such as, e.g., bipolar junction transistors or other suitable types of switching devices) may be employed.

Processor Overview

Figure 10:
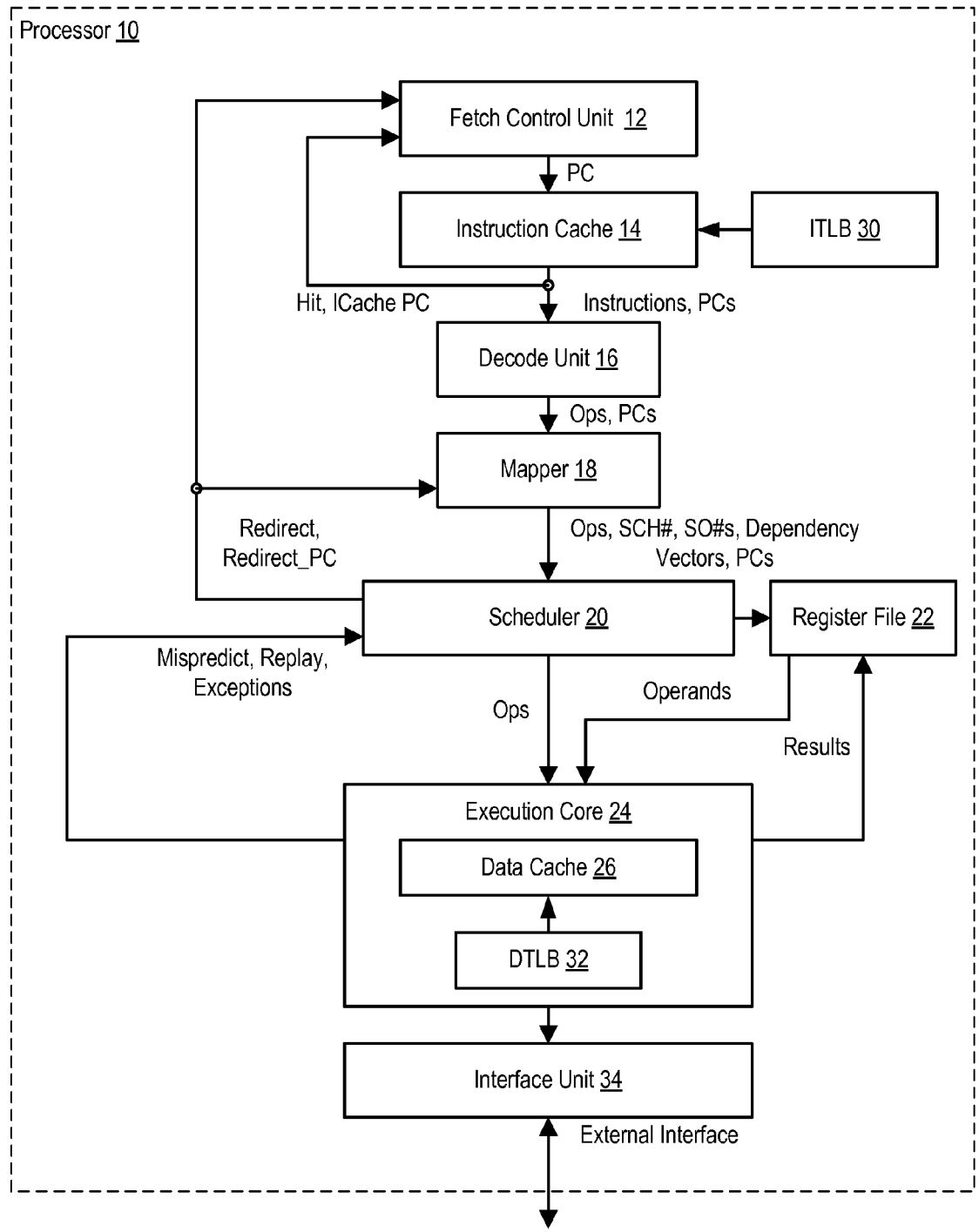
FIG. 10 illustrates an embodiment of a processor that may include one or more scannable pulse dynamic gates.

Turning now to FIG. 10, a block diagram of an embodiment of a processor 10 is shown. Processor 10 may include one or more scannable pulse dynamic gates that incorporate some or all of the features described above. In the illustrated embodiment, the processor 10 includes a fetch control unit 12, an instruction cache 14, a decode unit 16, a mapper 18, a scheduler 20, a register file 22, an execution core 24, and an interface unit 34. The fetch control unit 12 is coupled to provide a program counter address (PC) for fetching from the instruction cache 14. The instruction cache 14 is coupled to provide instructions (with PCs) to the decode unit 16, which is coupled to provide decoded instruction operations (ops, again with PCs) to the mapper 18. The instruction cache 14 is further configured to provide a hit indication and an ICache PC to the fetch control unit 12. The mapper 18 is coupled to provide ops, a scheduler number (SCH#), source operand numbers (SO#s), one or more dependency vectors, and PCs to the scheduler 20. The scheduler 20 is coupled to receive replay, mispredict, and exception indications from the execution core 24, is coupled to provide a redirect indication and redirect PC to the fetch control unit 12 and the mapper 18, is coupled to the register file 22, and is coupled to provide ops for execution to the execution core 24. The register file is coupled to provide operands to the execution core 24, and is coupled to receive results to be written to the register file 22 from the execution core 24. The execution core 24 is coupled to the interface unit 34, which is further coupled to an external interface of the processor 10.

Fetch control unit 12 may be configured to generate fetch PCs for instruction cache 14. In some embodiments, fetch control unit 12 may include one or more types of branch predictors. For example, fetch control unit 12 may include indirect branch target predictors configured to predict the target address for indirect branch instructions, conditional branch predictors configured to predict the outcome of conditional branches, and/or any other suitable type of branch predictor. During operation, fetch control unit 12 may generate a fetch PC based on the output of a selected branch predictor. If the prediction later turns out to be incorrect, fetch control unit 12 may be redirected to fetch from a different address. When generating a fetch PC, in the absence of a nonsequential branch target (i.e., a branch or other redirection to a nonsequential address, whether speculative or non-speculative), fetch control unit 12 may generate a fetch PC as a sequential function of a current PC value. For example, depending on how many bytes are fetched from instruction cache 14 at a given time, fetch control unit 12 may generate a sequential fetch PC by adding a known offset to a current PC value.

The instruction cache 14 may be a cache memory for storing instructions to be executed by the processor 10. The instruction cache 14 may have any capacity and construction (e.g. direct mapped, set associative, fully associative, etc.). The instruction cache 14 may have any cache line size. For example, 64 byte cache lines may be implemented in an embodiment. Other embodiments may use larger or smaller cache line sizes. In response to a given PC from the fetch control unit 12, the instruction cache 14 may output up to a maximum number of instructions. It is contemplated that processor 10 may implement any suitable instruction set architecture (ISA), such as, e.g., the ARM™, PowerPC™, or x86 ISAs, or combinations thereof.

In some embodiments, processor 10 may implement an address translation scheme in which one or more virtual address spaces are made visible to executing software. Memory accesses within the virtual address space are translated to a physical address space corresponding to the actual physical memory available to the system, for example using a set of page tables, segments, or other virtual memory translation schemes. In embodiments that employ address translation, the instruction cache 14 may be partially or completely addressed using physical address bits rather than virtual address bits. For example, instruction cache 14 may use virtual address bits for cache indexing and physical address bits for cache tags.

In order to avoid the cost of performing a full memory translation when performing a cache access, processor 10 may store a set of recent and/or frequently-used virtual-to-physical address translations in a translation lookaside buffer (TLB), such as Instruction TLB (ITLB) 30. During operation, ITLB 30 (which may be implemented as a cache, as a content addressable memory (CAM), or using any other suitable circuit structure) may receive virtual address information and determine whether a valid translation is present. If so, ITLB 30 may provide the corresponding physical address bits to instruction cache 14. If not, ITLB 30 may cause the translation to be determined, for example by raising a virtual memory exception.

The decode unit 16 may generally be configured to decode the instructions into instruction operations (ops). Generally, an instruction operation may be an operation that the hardware included in the execution core 24 is capable of executing. Each instruction may translate to one or more instruction operations which, when executed, result in the operation(s) defined for that instruction being performed according to the instruction set architecture implemented by the processor 10. In some embodiments, each instruction may decode into a single instruction operation. The decode unit 16 may be configured to identify the type of instruction, source operands, etc., and the decoded instruction operation may include the instruction along with some of the decode information. In other embodiments in which each instruction translates to a single op, each op may simply be the corresponding instruction or a portion thereof (e.g. the opcode field or fields of the instruction). In some embodiments in which there is a one-to-one correspondence between instructions and ops, the decode unit 16 and mapper 18 may be combined and/or the decode and mapping operations may occur in one clock cycle. In other embodiments, some instructions may decode into multiple instruction operations. In some embodiments, the decode unit 16 may include any combination of circuitry and/or microcoding in order to generate ops for instructions.

For example, relatively simple op generations (e.g. one or two ops per instruction) may be handled in hardware while more extensive op generations (e.g. more than three ops for an instruction) may be handled in microcode.

Ops generated by the decode unit 16 may be provided to the mapper 18. The mapper 18 may implement register renaming to map source register addresses from the ops to the source operand numbers (SO#s) identifying the renamed source registers. Additionally, the mapper 18 may be configured to assign a scheduler entry to store each op, identified by the SCH#. In an embodiment, the SCH# may also be configured to identify the rename register assigned to the destination of the op. In other embodiments, the mapper 18 may be configured to assign a separate destination register number. Additionally, the mapper 18 may be configured to generate dependency vectors for the op. The dependency vectors may identify the ops on which a given op is dependent. In an embodiment, dependencies are indicated by the SCH# of the corresponding ops, and the dependency vector bit positions may correspond to SCH#s. In other embodiments, dependencies may be recorded based on register numbers and the dependency vector bit positions may correspond to the register numbers.

The mapper 18 may provide the ops, along with SCH#, SO#s, PCs, and dependency vectors for each op to the scheduler 20. The scheduler 20 may be configured to store the ops in the scheduler entries identified by the respective SCH#s, along with the SO#s and PCs. The scheduler may be configured to store the dependency vectors in dependency arrays that evaluate which ops are eligible for scheduling. The scheduler 20 may be configured to schedule the ops for execution in the execution core 24. When an op is scheduled, the scheduler 20 may be configured to read its source operands from the register file 22 and the source operands may be provided to the execution core 24. The execution core 24 may be configured to return the results of ops that update registers to the register file 22. In some cases, the execution core 24 may forward a result that is to be written to the register file 22 in place of the value read from the register file 22 (e.g. in the case of back to back scheduling of dependent ops).

The execution core 24 may also be configured to detect various events during execution of ops that may be reported to the scheduler. Branch ops may be mispredicted, and some load/store ops may be replayed (e.g. for address-based conflicts of data being written/read). Various exceptions may be detected (e.g. protection exceptions for memory accesses or for privileged instructions being executed in non-privileged mode, exceptions for no address translation, etc.). The exceptions may cause a corresponding exception handling routine to be executed.

The execution core 24 may be configured to execute predicted branch ops, and may receive the predicted target address that was originally provided to the fetch control unit 12. The execution core 24 may be configured to calculate the target address from the operands of the branch op, and to compare the calculated target address to the predicted target address to detect correct prediction or misprediction. The execution core 24 may also evaluate any other prediction made with respect to the branch op, such as a prediction of the branch op's direction. If a misprediction is detected, execution core 24 may signal that fetch control unit 12 should be redirected to the correct fetch target. Other units, such as the scheduler 20, the mapper 18, and the decode unit 16 may flush pending ops/instructions from the speculative instruction stream that are subsequent to or dependent upon the mispredicted branch.

The execution core may include a data cache 26, which may be a cache memory for storing data to be processed by the processor 10. Like the instruction cache 14, the data cache 26 may have any suitable capacity, construction, or line size (e.g. direct mapped, set associative, fully associative, etc.). Moreover, the data cache 26 may differ from the instruction cache 14 in any of these details. As with instruction cache 14, in some embodiments, data cache 26 may be partially or entirely addressed using physical address bits. Correspondingly, a data TLB (DTLB) 32 may be provided to cache virtual-to-physical address translations for use in accessing the data cache 26 in a manner similar to that described above with respect to ITLB 30. It is noted that although ITLB 30 and DTLB 32 may perform similar functions, in various embodiments they may be implemented differently. For example, they may store different numbers of translations and/or different translation information.

The register file 22 may generally include any set of registers usable to store operands and results of ops executed in the processor 10. In some embodiments, the register file 22 may include a set of physical registers and the mapper 18 may be configured to map the logical registers to the physical registers. The logical registers may include both architected registers specified by the instruction set architecture implemented by the processor 10 and temporary registers that may be used as destinations of ops for temporary results (and sources of subsequent ops as well). In other embodiments, the register file 22 may include an architected register set containing the committed state of the logical registers and a speculative register set containing speculative register state.

The interface unit 24 may generally include the circuitry for interfacing the processor 10 to other devices on the external interface. The external interface may include any type of interconnect (e.g. bus, packet, etc.). The external interface may be an on-chip interconnect, if the processor 10 is integrated with one or more other components (e.g. a system on a chip configuration). The external interface may be on off-chip interconnect to external circuitry, if the processor 10 is not integrated with other components. In various embodiments, the processor 10 may implement any instruction set architecture.

System and Computer Accessible Storage Medium

Figure 11:
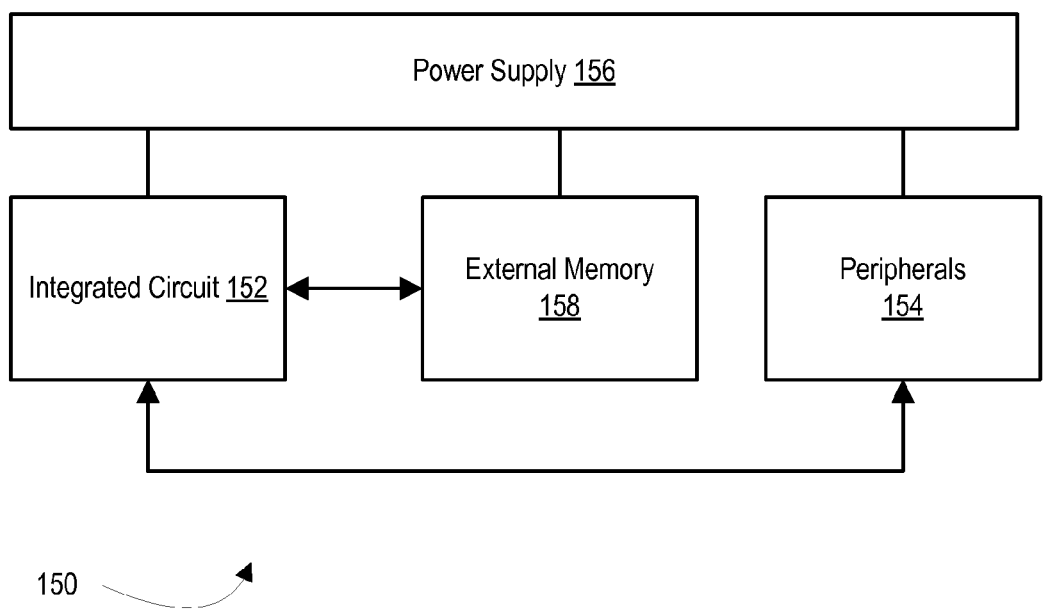
FIG. 11 illustrates an embodiment of a system that may include a processor.

Turning next to FIG. 11, a block diagram of an embodiment of a system 150 is shown. In the illustrated embodiment, the system 150 includes at least one instance of an integrated circuit 152. The integrated circuit 152 may include one or more instances of the processor 10 (from FIG. 9). The integrated circuit 152 may, in an embodiment, be a system on a chip including one or more instances of the processor 10 and various other circuitry such as a memory controller, video and/or audio processing circuitry, on-chip peripherals and/or peripheral interfaces to couple to off-chip peripherals, etc. The integrated circuit 152 is coupled to one or more peripherals 154 and an external memory 158. A power supply 156 is also provided which supplies the supply voltages to the integrated circuit 152 as well as one or more supply voltages to the memory 158 and/or the peripherals 154. In some embodiments, more than one instance of the integrated circuit 152 may be included (and more than one external memory 158 may be included as well).

The peripherals 154 may include any desired circuitry, depending on the type of system 150. For example, in an embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may include SRAM, nonvolatile RAM (NVRAM, such as "flash" memory), and/or dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus, comprising:
an evaluation network coupled to evaluate one or more inputs during assertion of an evaluate pulse and to selectively discharge a dynamic node dependent upon the one or more inputs, wherein during a normal non-scan mode of operation, the evaluate pulse is derived from a clock signal and is asserted for a shorter duration than the clock signal is asserted;
one or more output devices coupled to the dynamic node, wherein during operation, the one or more output devices drive an output node dependent upon the dynamic node; and
one or more scan input devices coupled to load scan input data onto the output node in response to assertion of a master scan clock during a scan mode of operation; and
a storage element coupled to receive and store a value of the output node in response to assertion of a slave scan clock during the scan mode of operation, wherein the storage element is further coupled to drive a scan data output.

2. The apparatus of claim 1, wherein the evaluation network comprises one or more devices arranged to implement a logical function of the one or more inputs, wherein in response to the one or more inputs satisfying the logical function during assertion of the evaluate pulse, one or more discharge paths through the evaluation network are generated among the one or more devices.

3. The apparatus of claim 2, wherein the one or more devices include one or more N-type field effect transistors (NFETs).

4. The apparatus of claim 1, wherein the one or more inputs are encoded in a 1-of-N format.

5. The apparatus of claim 1, wherein the evaluate pulse is asserted during the scan mode of operation.

6. The apparatus of claim 1, wherein the evaluate pulse is derived from the clock signal such that a rising edge of the evaluate pulse occurs after a rising edge of the clock signal and a falling edge of the evaluate pulse occurs before a falling edge of the clock signal.

7. The apparatus of claim 1, further comprising one or more feedback devices controlled by the clock signal, wherein subsequent to discharge of the dynamic node and deassertion of the evaluate pulse, the one or more feedback devices are configured to maintain the output node in an asserted state.

8. The apparatus of claim 7, wherein in response to deassertion of the clock signal, the one or more feedback devices are configured to reset the output node to a deasserted state.

9. An integrated circuit, comprising:
a plurality of scannable pulse dynamic logic gates; and
a scan chain interconnecting the scannable pulse dynamic logic gates;
wherein each of the scannable pulse dynamic logic gates respectively comprises:
an evaluation network coupled to evaluate one or more inputs during assertion of an evaluate pulse and to selectively discharge a dynamic node dependent upon the one or more inputs, wherein during a normal non-scan mode of operation, the evaluate pulse is derived from a clock signal and is asserted for a shorter duration than the clock signal is asserted;
one or more output devices coupled to the dynamic node, wherein during operation, the one or more output devices drive an output node dependent upon the dynamic node; and
one or more scan input devices coupled to load scan input data onto the output node in response to assertion of a master scan clock during a scan mode of operation; and
a storage element coupled to receive and store a value of the output node in response to assertion of a slave scan clock during the scan mode of operation, wherein the storage element is further coupled to drive a scan data output.

10. The integrated circuit of claim 9, wherein the evaluation network comprises one or more devices arranged to implement a logical function of the one or more inputs, wherein in response to the one or more inputs satisfying the logical function during assertion of the evaluate pulse, one or more discharge paths through the evaluation network are generated among the one or more devices.

11. The integrated circuit of claim 9, wherein the one or more inputs are encoded in a 1-of-N format.

12. A system, comprising:
a memory; and
a processor coupled to the memory, wherein the processor comprises a plurality of scannable pulse dynamic logic gates;
wherein each of the scannable pulse dynamic logic gates respectively comprises:
an evaluation network coupled to evaluate one or more inputs during assertion of an evaluate pulse and to selectively discharge a dynamic node dependent upon the one or more inputs, wherein during a normal non-scan mode of operation, the evaluate pulse is derived from a clock signal and is asserted for a shorter duration than the clock signal is asserted;
one or more output devices coupled to the dynamic node, wherein during operation, the one or more output devices drive an output node dependent upon the dynamic node; and
one or more scan input devices coupled to load scan input data onto the output node in response to assertion of a master scan clock during a scan mode of operation; and
a storage element coupled to receive and store a value of the output node in response to assertion of a slave scan clock during the scan mode of operation, wherein the storage element is further coupled to drive a scan data output.

13. The system of claim 12, wherein the one or more inputs are encoded in a 1-of-N format.

14. A method, comprising:
evaluating one or more inputs of a logic gate during assertion of an evaluate pulse and selectively discharging a dynamic node dependent upon the one or more inputs, wherein during a normal non-scan mode of operation, the evaluate pulse is derived from a clock signal and is asserted for a shorter duration than the clock signal is asserted;
driving an output node of the logic gate dependent upon the dynamic node;
during a scan mode of operation, loading scan input data onto the output node in response to assertion of a master scan clock during; and
during the scan mode of operation, storing a value of the output node in a storage element in response to assertion of a slave scan clock, wherein the storage element is coupled to drive a scan data output of the logic gate.

15. The method of claim 14, wherein selectively discharging the dynamic node comprises generating one or more discharge paths through an evaluation network comprising one or more devices arranged to implement a logical function of the one or more inputs.

16. The method of claim 15, wherein the one or more devices include on or more N-type field effect transistors (NFETs).

17. The method of claim 14, wherein the one or more inputs are encoded in a 1-of-N format.

18. The method of claim 14, further comprising asserting the evaluate pulse during the scan mode of operation.

19. The method of claim 14, further comprising deriving the evaluate pulse from the clock signal that a rising edge of the evaluate pulse occurs after a rising edge of the clock signal and a falling edge of the evaluate pulse occurs before a falling edge of the clock signal.

20. The method of claim 14, further comprising maintaining the output node in an asserted state subsequent to discharge of the dynamic node and deassertion of the evaluate pulse.

* * * * *

UNITED STATES PATENT AND TRADEMARK OFFICE
CERTIFICATE OF CORRECTION

| | | |
|---|---|---|
| PATENT NO. | : 8,555,121 B2 | Page 1 of 1 |
| APPLICATION NO. | : 13/026892 | |
| DATED | : October 8, 2013 | |
| INVENTOR(S) | : Michael R. Seningen et al. | |

It is certified that error appears in the above-identified patent and that said Letters Patent is hereby corrected as shown below:

In the Claims:

In column 18, line 5 (claim 16), delete "on or more" and insert --one or more-- therefor.

Signed and Sealed this
Twenty-eighth Day of January, 2014

Michelle K. Lee
*Deputy Director of the United States Patent and Trademark Office*